(12) United States Patent
Shin

(10) Patent No.: US 8,027,203 B2
(45) Date of Patent: Sep. 27, 2011

(54) PIPE LATCH CIRCUIT OF MULTI-BIT PREFETCH-TYPE SEMICONDUCTOR MEMORY DEVICE WITH IMPROVED STRUCTURE

(75) Inventor: Beom Ju Shin, Icheon-si (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 389 days.

(21) Appl. No.: 12/071,430

(22) Filed: Feb. 21, 2008

(65) Prior Publication Data
US 2008/0144397 A1  Jun. 19, 2008

Related U.S. Application Data

(63) Continuation of application No. 11/158,345, filed on Jun. 22, 2005, now Pat. No. 7,355,899.

(30) Foreign Application Priority Data

Dec. 22, 2004  (KR) .......................... 10-2004-110495

(51) Int. Cl.
G11C 7/10  (2006.01)
(52) U.S. Cl. ................................. 365/189.05
(58) Field of Classification Search .............. 365/189.05
See application file for complete search history.

(56) References Cited

U.S. PATENT DOCUMENTS

| | | | |
|---|---|---|---|
| 6,201,760 B1 | 3/2001 | Yun et al. | |
| 6,549,444 B2 | 4/2003 | Kyung et al. | |
| 6,785,168 B2 | 8/2004 | Yoon | |
| 6,950,350 B1 * | 9/2005 | Kerl | 365/193 |
| 7,184,323 B2 | 2/2007 | Fujisawa | |
| 2002/0169919 A1 * | 11/2002 | Ho | 711/1 |
| 2007/0070712 A1 | 3/2007 | Shin | |
| 2007/0223287 A1 | 9/2007 | Lee | |

* cited by examiner

Primary Examiner — Hoai Ho
Assistant Examiner — Anthan Tran
(74) Attorney, Agent, or Firm — Lowe Hauptman Ham & Berner LLP

(57) ABSTRACT

Provided is a pipe latch circuit of a multi-bit pre-fetch type semiconductor memory device with an advanced structure. The pipe latch circuit of the present invention comprises: a first latch circuit for latching pre-fetched plural bits of input data from global input/output lines; a first multiplexing circuit comprises a first multiplexer for selecting a certain input data from first group of the input data in response to a first selection control signal and a second multiplexer for selecting a certain input data from second group of the input data in response to a second selection control signal; a second multiplexing circuit for setting a sequence of output data from the first multiplexing circuit in response to a third selection control signal; and a second latch circuit comprises a third latch for latching a first output data from the second multiplexing circuit in response to a first output latch control signal and a fourth latch for latching a second output data from the second multiplexing circuit in response to a second output latch control signal. The invention cuts down the overall chip size and current consumption of the pipe latch circuit by reducing the number of multiplexers necessary for arranging the pre-fetched data in a predetermined output order.

7 Claims, 10 Drawing Sheets

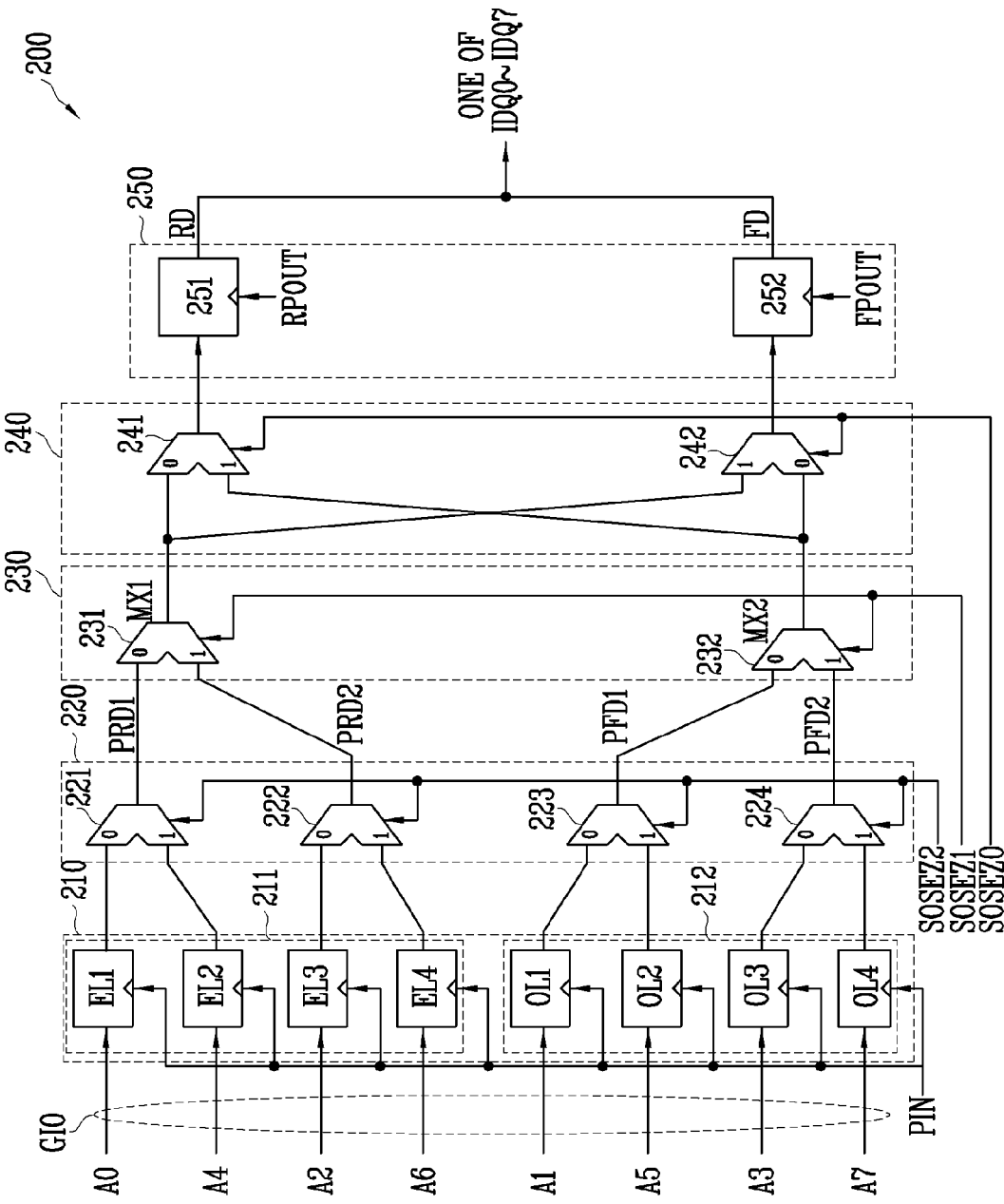

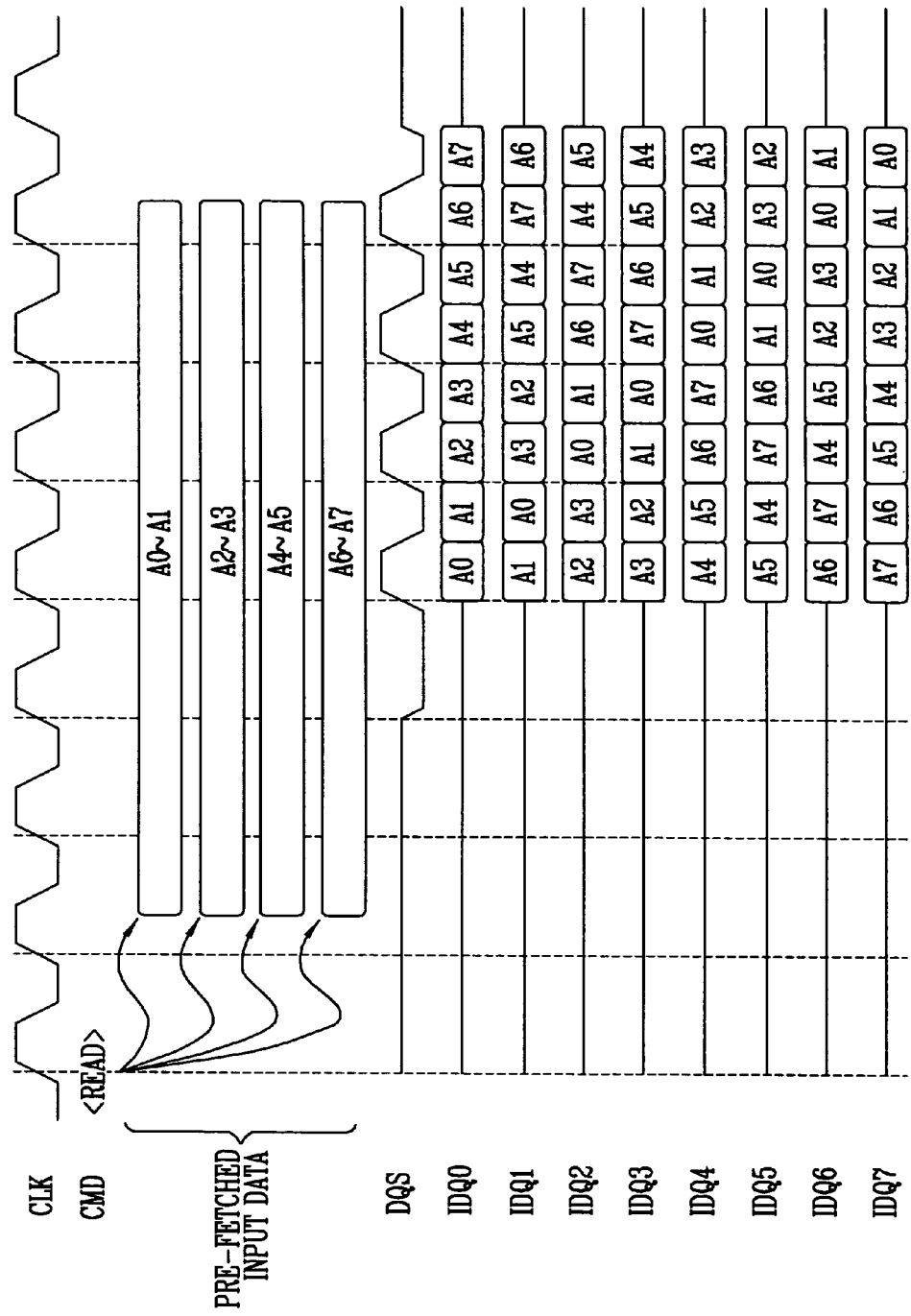

PIPE LATCH CIRCUIT OF MULTI-BIT PREFETCH-TYPE SEMICONDUCTOR MEMORY DEVICE WITH IMPROVED STRUCTURE

CROSS REFERENCE TO RELATED APPLICATION

This application is a Continuation of U.S. Ser. No. 11/158,345, filed on Jun. 22, 2005 now U.S. Pat. No. 7,355,899. This application, in its entirety, is incorporated herein by reference.

BACKGROUND

1. Field of the Invention

The present invention relates to a semiconductor memory device and specifically, to a pipe latch circuit of a multi-bit pre-fetch type semiconductor memory device.

2. Discussion of Related Art

In general, data input and output operations of synchronous semiconductor memory devices are carried out in sync with an internal clock signal generated on basis of an external clock signal. Such synchronous semiconductor memory devices include single data rate (SDR) synchronous dynamic random access memory (SDRAM), double data rate (DDR) synchronous DRAM, and DDR2 SDRAM. Among them, the DDR2 SDRAM generally uses a 4-bit pre-fetch scheme. The 4-bit pre-fetch scheme is a data processing way reading 4-bit data out of memory cells in parallel in response to a single read command and then outputting the read 4-bit data through the same data input/output pin for two clock cycles. Such a DDR2 SDRAM is generally configured as shown in FIG. 1. FIG. 1 is a schematic block diagram of a multi-bit pre-fetch type semiconductor memory device including a conventional pipe latch circuit. Referring to FIG. 1, the semiconductor memory device 10 includes a controller 11, an address input circuit 12, a bank controller 13, an internal core circuit 14, an input/output gating circuit 15, a pipe latch circuit 16, an output driver 17, an input circuit 18, and an input receiver 19. The pipe latch circuit 16 receives data bits D0~D3 supplied from the input/output gating circuit 15 through a global input/output line GIO and outputs the data bits D0~D3 in the order of data by a sequential or interleaving mode in response to control signals PIN, SOSEZ0, SOSEZ1_RD, SOSEZ1_FD, RPOUT, and FPOUT. From FIG. 1, operations of internal blocks of the semiconductor memory device 10, except the pipe latch circuit 16, may be easily understood by those skilled in this art, so it will not be described in detail.

FIG. 2 is a detailed block diagram of the pipe latch circuit shown in FIG. 1. Referring to FIG. 2, the pipe latch circuit 10 includes a first latch circuit 20, a first multiplexing circuit 30, a second multiplexing circuit 40, a second latch circuit 50. The first latch circuit 20 includes latches 21~24 simultaneously latching the data bits D0~D3, which are pre-fetched from the global input/output line GIO, in response to the control signal PIN. The multiplexing circuit 30 includes multiplexers 31~34. The multiplexers 31 and 32 select the data bits D0 and D1 independently, which are supplied from the latches 21 and 22, in response to the control signal SOSEZ1, and output the selected data bits as second data bits PRE_FD1 and PRE_FD2 respectively. The multiplexers 33 and 34 select the data bits D2 and D3 independently, which are supplied from the latches 23 and 24, in response to the control signal SOSEZ0, and output the selected data bits as second data bits PRE_FD1 and PRE_FD2 respectively. The multiplexing circuit 40 includes multiplexers 41~42. The multiplexer 41 selects the first selected bits PRE_RD1 and PRE_RD2 in response to the control signal SOSEZ1_RD, and outputs the selected data bit. The multiplexer 42 selects the second selected bits PRE_FD1 and PRE_FD2 in response to the control signal SOSEZ1_FD, and outputs the selected data bit. The second latch circuit 50 includes latches 51 and 52. The latch 51 holds (or latches) an output signal of the multiplexer 41 in response to the control signal RPOUT, and outputs the latched signal as an output data bit RDOB. And, the latch 52 holds (or latches) an output signal of the multiplexer 42 in response to the control signal FPOUT, and outputs the latched signal as an output data bit FDOB. Here, the control signals SOSEZ0, SOSEZ1_RD, and SOSEZ1_FD are enabled in response to generation of the read command. As a result, an order of the data bits D0~D3 output from the pipe latch circuit 16 is arranged by the control signals SOSEZ0, SOSEZ1_RD, and SOSEZ1_FD. Meanwhile, the conventional pipe latch circuit 16 aforementioned includes six multiplexers to arrange the data bits D0~D3 in a predetermined output order. Since the pipe latch circuit is constructed with the feature that one input/output pin is connected to three or four output terminals, the pipe latch circuit more occupies the circuit area as the number of input/output pins of the semiconductor memory device increases. As a result, a size of the pipe latch circuit may hinder in designing a layout construction for internal circuits of the semiconductor memory device. Furthermore, a dimensional increase of the pipe latch circuit causes an increase of the overall chip size.

SUMMARY OF THE INVENTION

The present invention is directed to providing a pipe latch circuit of a multi-bit pre-fetch type semiconductor memory device with a smaller circuit area.

According to one aspect, the present invention is to provide a pipe latch circuit of semiconductor memory device, including a first latch circuit for latching pre-fetched plural bits of input data from global input/output lines; a first multiplexing circuit comprises a first multiplexer for selecting a certain input data from first group of the input data in response to a first selection control signal and a second multiplexer for selecting a certain input data from second group of the input data in response to a second selection control signal; a second multiplexing circuit for setting a sequence of output data from the first multiplexing circuit in response to a third selection control signal; and a second latch circuit comprises a third latch for latching a first output data from the second multiplexing circuit in response to a first output latch control signal and a fourth latch for latching a second output data from the second multiplexing circuit in response to a second output latch control signal.

According to another aspect, the present invention is to provide a pipe latch circuit of semiconductor memory device, including a first latch circuit for latching pre-fetched plural bits of input data from global input/output lines; a first multiplexing circuit comprises a first multiplexer for selecting a certain input data from first group of the input data in response to a first selection control signal, and a second multiplexer for selecting a certain input data from second group of the input data in response to the first selection control signal, a third multiplexer for selecting a certain input data from third group of the input data in response to the first selection control signal, and a fourth multiplexer for selecting a certain input data from fourth group of the input data in response to the first selection control signal; a second multiplexing circuit comprises a fifth multiplexer for selecting a output from the first multiplexer and the second multiplexer in response to a second selection control signal and a sixth multiplexer for selecting a output from the third multiplexer and the fourth multiplexer in response to the second selection control signal; a third multiplexing circuit for setting a sequence of output data from the second multiplexing circuit in response to a third selection control signal; and a second latch circuit comprises a third latch for latching a first output data from the third multiplexing circuit in response to a first output latch control signal and a fourth latch for latching a second output data from the third multiplexing circuit in response to a second output latch control signal.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings:

FIG. 10 is a detailed block diagram illustrating the pipe latch circuit shown in FIG. 9; and FIG. 11 is a timing diagram illustrating signals relevant to an operation of the pipe latch circuit shown in FIG. 10.

DETAILED DESCRIPTION OF PREFERRED EMBODIMENTS

Figure 1:
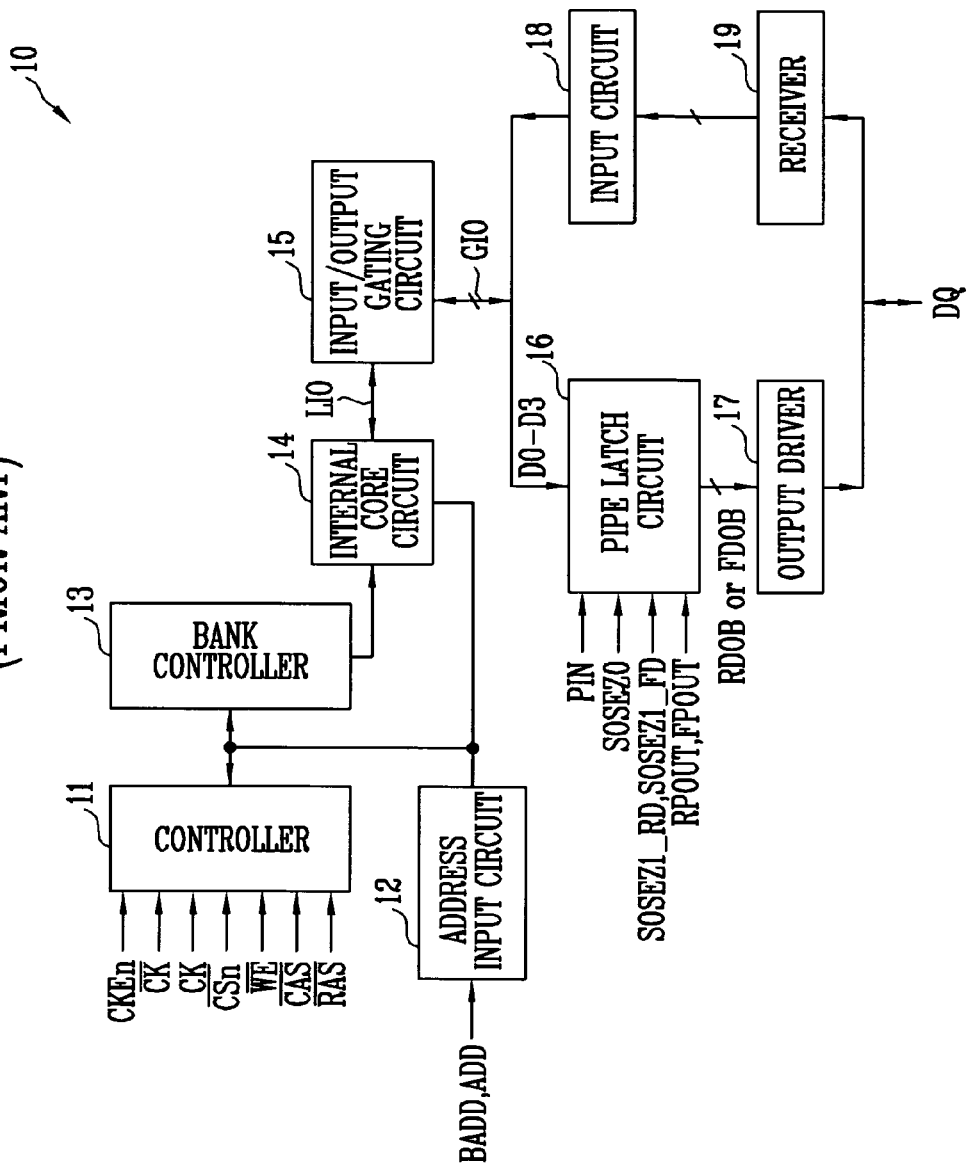
FIG. 1 is a schematic block diagram of a multi-bit pre-fetch type semiconductor memory device including a conventional pipe latch circuit.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, like numerals refer to like elements throughout the specification.

Figure 3:
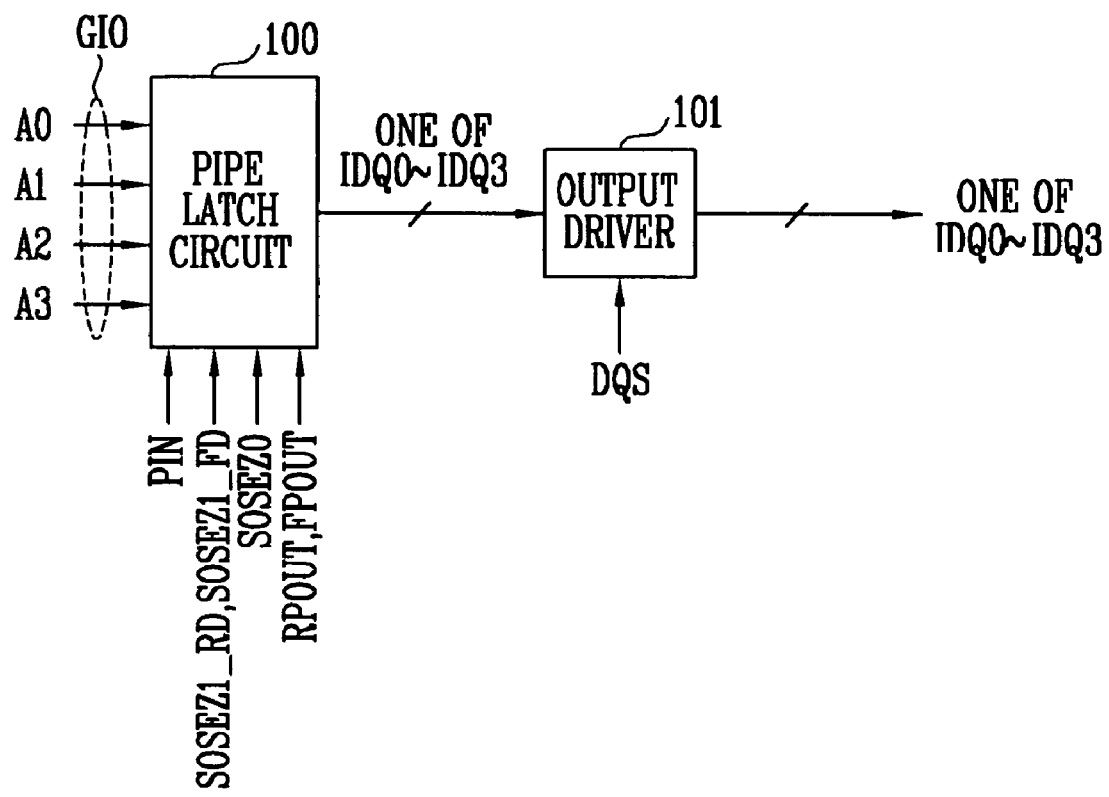
FIG. 3 is a block diagram illustrating a pipe latch circuit and an output driver in accordance with an embodiment of the present invention.

FIG. 3 is a block diagram illustrating a pipe latch circuit and an output driver in accordance with an embodiment of the present invention. The pipe latch circuit shown in FIG. 3 may be applicable to a semiconductor memory device (e.g., DDR2 SDRAM) employing a 4-bit pre-fetch scheme. Referring to FIG. 3, the pipe latch circuit 100 receives input data bits A0~A3, which are simultaneously pre-fetched from the core circuit (not shown), through a global input/output line GIO. The pipe latch circuit 100 outputs one of output data IDQ0~IDQ3 in response to an input latch control signal PIN, selection control signals SOSEZ1_RD, SOSEZ1_FD, and SOSEZ0, and output latch control signals RPOUT and FPOUT. The output data IDQ0~IDQ3 contain the input data bits A0~A3 arranged in different orders each other. The output driver 101 outputs one of the output data IDQ0~IDQ3, which are received from the pipe latch circuit 100, in response to an output control signal DQS.

Figure 4:
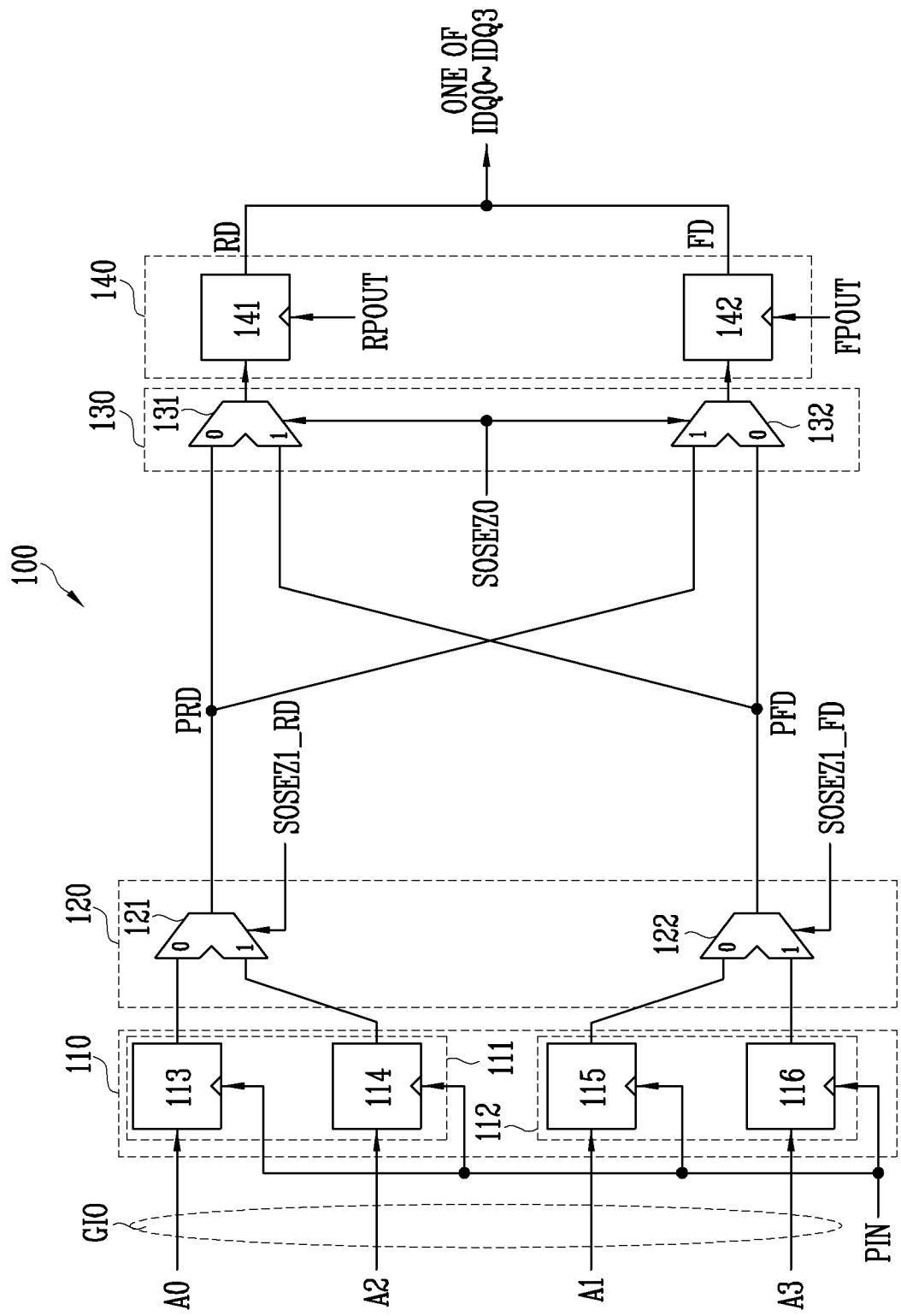
FIG. 4 is a detailed block diagram illustrating the pipe latch circuit shown in FIG. 3.

FIG. 4 is a detailed block diagram illustrating the pipe latch circuit shown in FIG. 3. Referring to FIG. 4, the pipe latch circuit 100 is comprised of a first latch circuit 110, a first multiplexing circuit 120, a second multiplexing circuit 130, and a second latch circuit 140. The first latch circuit 110 includes an even latch circuit 111 and an odd latch circuit 112. The even latch circuit 111 includes latches 113 and 114, and the odd latch circuit 112 includes latches 115 and 116. The latches 113 and 114 holds even-ordered bits among the pre-fetched input data bits A0~A3, i.e., the input data bits A0 and A2, in response to the input latch control signal PIN. And, the latches 115 and 116 holds odd-ordered bits among the pre-fetched input data bits A0~A3, i.e., the input data bits A1 and A3, in response to the input latch control signal PIN. The input latch control signal PIN is enabled in response to a read command that is provided for the pre-fetch of the input data bits A0~A3.

The multiplexing circuit 120 includes multiplexers 121 and 122. The multiplexer 121 selects one of first group of input data bits A0 and A2, which are received from the latches 113 and 114, in response to the selection control signal SOSEZ1_RD, and then outputs a selection data bit PRD. In detail, when the selection control signal SOSEZ1_RD is on logic '1' (or enabled), the multiplexer 121 selects the input data bit A2. When the selection control signal SOSEZ1_RD is on logic '0' (or disabled), the multiplexer 121 selects the input data bit A0. The multiplexer 122 selects one of second group of input data bits A1 and A3, which are received from the latches 115 and 116, in response to the selection control signal SOSEZ1_FD, and then outputs a selection data bit PFD. In detail, when the selection control signal SOSEZ1_FD is on logic '1' (or enabled), the multiplexer 122 selects the input data bit A3. When the selection control signal SOSEZ1_FD is on logic '0' (or disabled), the multiplexer 122 selects the input data bit A1.

The multiplexing circuit 130 includes multiplexers 131 and 132. The multiplexing circuit 130 sets a sequence of output data from the first multiplexing circuit 120 in response to the selection control signal SOSEZ0. The multiplexer 131 selects one of the selection data bits PRD and PFD as the first output data in response to the selection control signal SOSEZ0. Also, the multiplexer 132 selects the other of the selection data bits PRD and PFD as the second output data in response to the selection control signal SOSEZ0. In detail, when the selection control signal SOSEZ0 is on logic '1' (or enabled), the multiplexer 131 selects the selection data bit PFD while the multiplexer 132 selects the selection data bit PRD. Otherwise, when the selection control signal SOSEZ0 is on logic '0' (or disabled), the multiplexer 131 selects the selection data bit PRD while the multiplexer 132 selects the selection data bit PFD. Here, the selection control signals SOSEZ1_RD, SOSEZ1_FD, and SOSEZ0 are enabled or disabled dependent on values of partial lower bits of column address signals supplied from the external when the read command is active for the pre-fetch of the input data bits A0~A3. In detail, logical states of the selection control signals are determined by the values of the two lower bits.

The second latch circuit 140 includes latches 141 and 142. The latch 141 holds an output signal of the multiplexer 131 in response to the output latch control signal RPOUT and then outputs the latched signal as an output data bit RD. The latch 142 holds an output signal of the multiplexer 132 in response to the output latch control signal FPOUT and then outputs the latched signal as an output data bit FD. While this, the output latch control signals RPOUT and FPOUT are alternately enabled. In detail, after the output latch control signal RPOUT is first enabled, the output latch control signal FPOUT is enabled. As a result, one of the output data IDQ0~IDQ3, including the output data bits RD and FD, is output from the pipe latch circuit 100.

Figure 5:
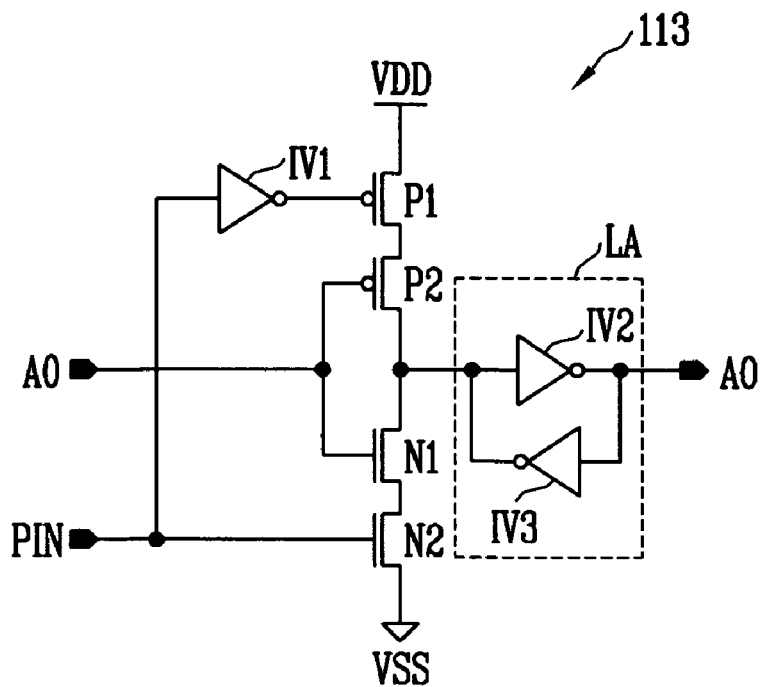
FIG. 5 is a detailed circuit diagram illustrating the latch shown in FIG. 4.

FIG. 5 is a detailed circuit diagram illustrating the latch 113 shown in FIG. 4. The structures and operations of the other latches 114~116, 141 and 142 are similar to those of the latch 113. Referring to FIG. 5, the latch 113 is composed of an inverter IV1, PMOS transistors P1 and P2, NMOS transistors N1 and N2, and a latch circuit LA. The latch circuit LA includes inverters IV2 and IV3. The PMOS and NMOS transistors P2 and N1 form a CMOS inverter circuit. The PMOS and NMOS transistors, P1 and N2, and the inverter IV1 enables or disables the CMOS inverter circuit in response to the input latch control signal PIN. As a result, when the input latch control signal PIN is enabled, the latch circuit 113 holds and outputs the input data bit A0.

Figure 6:
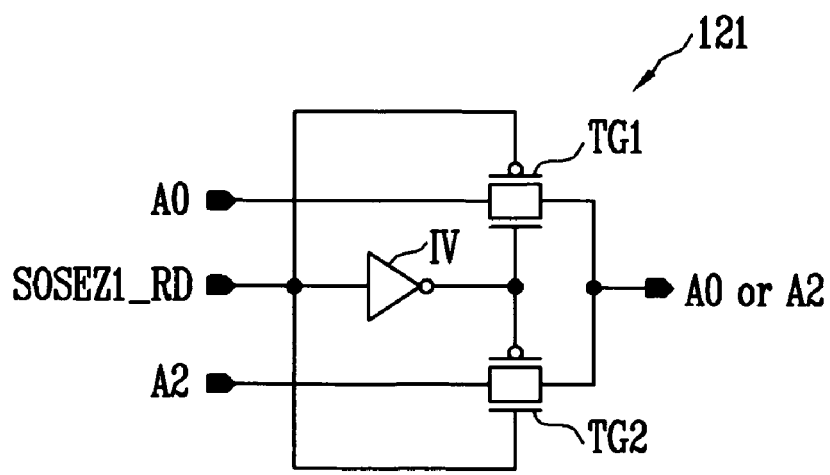
FIG. 6 is a detailed circuit diagram illustrating the multiplexer shown in FIG. 4.

FIG. 6 is a detailed circuit diagram illustrating the multiplexer 121 shown in FIG. 4. The structures and operations of the other multiplexers 122, 131 and 132 are similar to those of the multiplexer 121. Referring to FIG. 6, the multiplexer 121 includes an inverter 121, and transfer gates TG1 and TG2. The inverter IV outputs an inversed signal of the selection control signal SOSEZ1_RD. The transfer gates TG1 and TG2 receives the input data bits A0 an A2, respectively. The transfer gates TG1 and TG2 are alternatively turned on in response to the selection control signal SOSEZ1_RD and an output signal of the inverter IV, outputting one of the input data bits A0 and A2.

Figure 7:
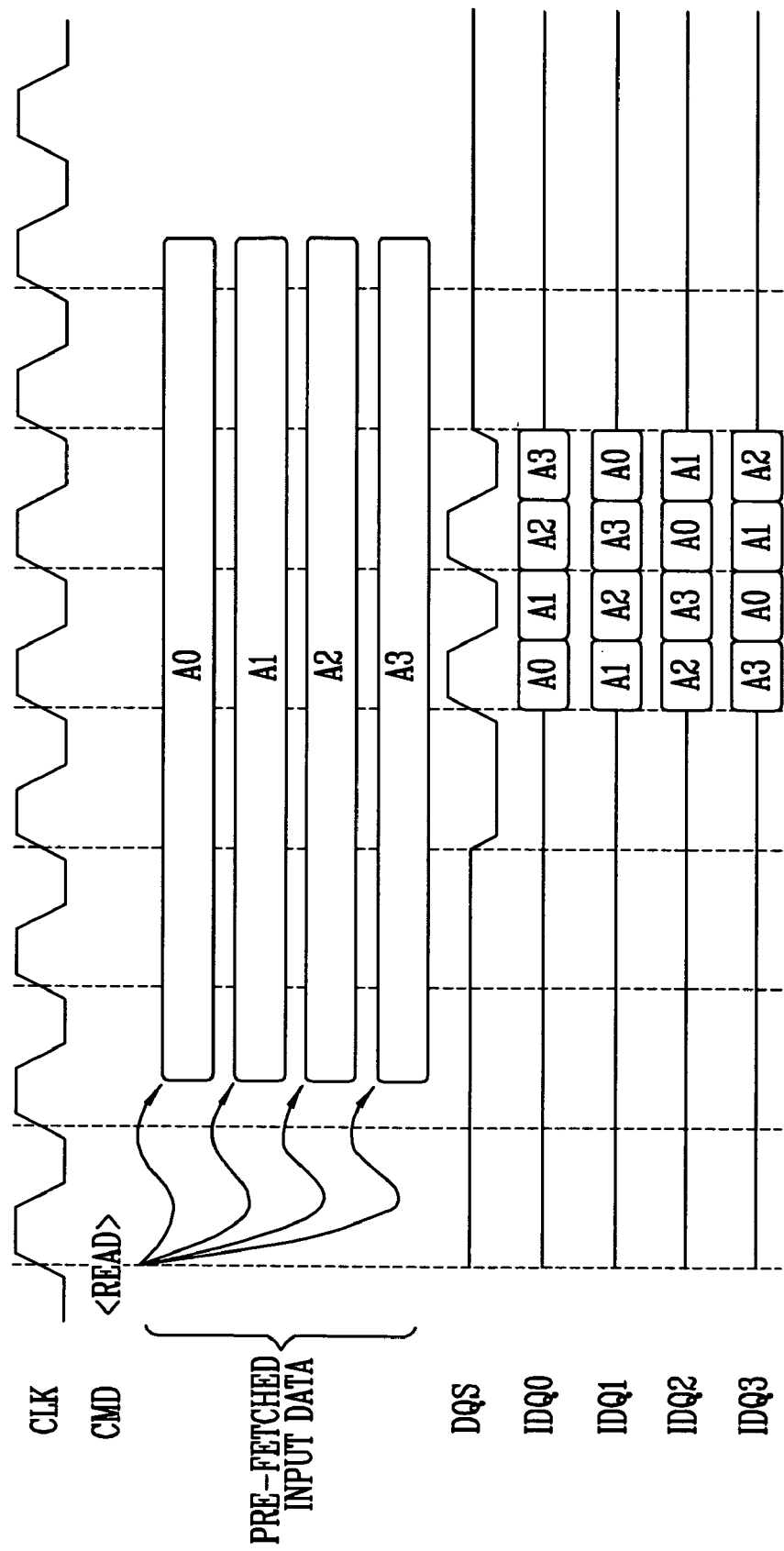
FIG. 7 is a timing diagram illustrating waveforms of signals involved in a sequential mode of the pipe latch circuit shown in FIG. 4.

Now, it will be described about an operation of the pipe latch circuit 100 in detail. The pipe latch circuit 100 is operable in a sequential or interleaving mode in compliance with the selection control signals SOSEZ1_RD, SOSEZ1_FD, and SOSEZ0. First, it is explained about the operation of the pipe latch circuit 100 in the sequential mode. FIG. 7 is a timing diagram illustrating waveforms of signals involved in the sequential mode of the pipe latch circuit shown in FIG. 4. Referring to FIG. 7, the input data bits A0~A3 of 4 bits are simultaneously pre-fetched from the internal core circuit of the semiconductor memory device in response to the read command READ. The first latch circuit 110 of the pipe latch circuit 100 simultaneously hold and output the input data bits A0~A3, which are received through the global input/output line GIO, in response to the input latch control signal PIN. For instance, when the lowest bits B1B0 (not shown) of a column address signal received when the read command READ is generated is '00' (i.e., the bits B1B0 is all zeros), the selection control signals SOSEZ1_RD and SOSEZ1_FD become logical '0' that is the same with the bit B0 at the first time and changes to logical '1' after 2-bit data is output from the second latch circuit 140. During this, the selection control signal SOSEZ0 retains logical '0' as same as the bit B0 until the input data bits A0~A3 are completely output by the pipe latch circuit 100. At the first time, as the selection control signals SOSEZ1_RD and SOSEZ1_FD are laid on logical '0', the multiplexer 121 selects and outputs the input data bit A0 as the selection data bit PRD while the multiplexer 122 selects and outputs the input data bit A1 as the selection data bit PFD.

And, as the selection control signal SOSEZ0 is laid on logical '0', the multiplexer 131 outputs the selection data bit PRD while the multiplexer 132 outputs the selection data bit PFD. The latch 141 of the second latch circuit 140 holds the selection data bit PRD in response to the output latch control signal RPOUT and then outputs the selection data bit PRD as the output data bit RD. As a result, the output data bits RD contains information of the input data bit A0. The latch 142 of the second latch circuit 140 holds the selection data bit PFD in response to the output latch control signal FPOUT and then outputs the selection data bit PFD as the output data bit FD. As a result, the output data bits FD contains information of the input data bit A1. After then, the selection control signals SOSEZ1_RD and SOSEZ1_FD change to logical '1'. Thus, the multiplexer 121 selects the input data bit A2 and outputs the selection data bit PRD, while the multiplexer 122 selects the input data bit A3 and outputs the selection data bit PFD. Further, the multiplexers, 131 and 132, selectively output the selection data bits, PRD and PFD, respectively. As a result, the selection data bits, PRD and PFD, contain the information of the input data bits A2 and A3, respectively. Thus, the pipe latch circuit 100 generates the output data IDQ0 in the order of A0, A1, A2, and A3 when the bits B1B0 of the column address signal are set on '00'.

When the bits B1B0 is valued with '01' (i.e., the decimal value of the bits B1B0 is 1), the selection control signal SOSEZ1_RD is logical '1' while the selection control signal SOSEZ1_FD is logical '0' at the first time. After then, if 2-bit data is output from the pipe latch circuit 100, the selection control signal SOSEZ1_RD retains logical '1' while the selection control signal SOSEZ1_FD changes to logical '1'. During this, the selection control signal SOSEZ0 maintains logical '1'. As a result, the pipe latch circuit 100 operates as similar as the aforementioned, generating the output data IDQ1 in the order of A1, A2, A3, and A0.

When the bits B1B0 is valued with '10' (i.e., the decimal value of the bits B1B0 is 2), the selection control signals SOSEZ1_RD and SOSEZ1_FD are all logical '1' at the first time. After then, if 2-bit data is output from the pipe latch circuit 100, the selection control signals SOSEZ1_RD and SOSEZ_FD change to logical '0'. During this, the selection control signal SOSEZ0 maintains logical '0'. As a result, the pipe latch circuit 100 operates as similar as the aforementioned, generating the output data IDQ2 in the order of A2, A3, A0, and A1.

When the bits B1B0 is valued with '11' (i.e., the decimal value of the bits B1B0 is 3), the selection control signal SOSEZ1_RD is logical '0' while the selection control signal SOSEZ1_FD is logical '1' at the first time. After then, if 2-bit data is output from the pipe latch circuit 100, the selection control signal SOSEZ1_RD retains logical '1' while the selection control signal SOSEZ1_FD changes to logical '0'. During this, the selection control signal SOSEZ0 maintains logical '1'. As a result, the pipe latch circuit 100 operates as similar as the aforementioned, generating the output data IDQ3 in the order of A3, A0, A1, and A2.

Figure 8:
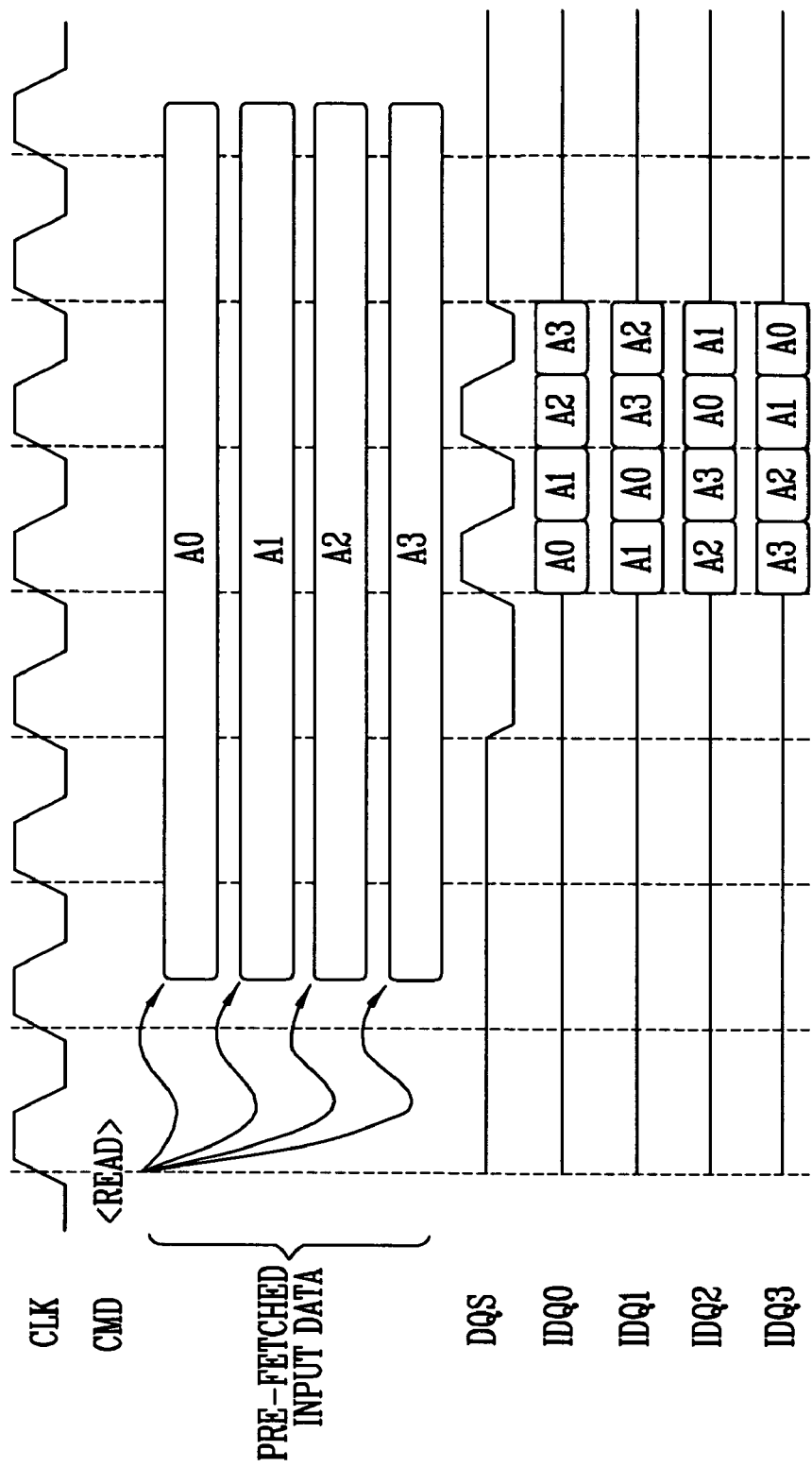
FIG. 8 is a timing diagram illustrating waveforms of signals involved in an interleaving mode of the pipe latch circuit shown in FIG. 4.

Next, it is explained about the operation of the pipe latch circuit 100 in the interleaving mode. FIG. 8 is a timing diagram illustrating waveforms of signals involved in an interleaving mode of the pipe latch circuit shown in FIG. 4. In the interleaving mode, the pipe latch circuit 100 is substantially similar to that in the sequential mode, but one matter. That is, the selection control signals SOSEZ1_RD and SOSEZ1_FD changes to logical '1' from logical '0' of their initial values when the bits B1B0 are 1 in decimal, while changes to logical '0' from logical '1' of their initial values when the bits B1B0 are 3 in decimal. As a result, the output latch circuit 100 generates the output data IDQ0 in the order of A0, A1, A2, and A3 when the bits B1B0 are valued in 0 in decimal, while generates the output data IDQ1 in the order of A1, A0, A3, and A2 when the bits B1B0 are valued in 1 in decimal. And, the output latch circuit 100 generates the output data IDQ2 in the order of A2, A3, A0, and A1 when the bits B1B0 are valued in 2 in decimal, while generates the output data IDQ3 in the order of A3, A2, A1, and A0 when the bits B1B0 are valued in 3 in decimal.

Figure 2:
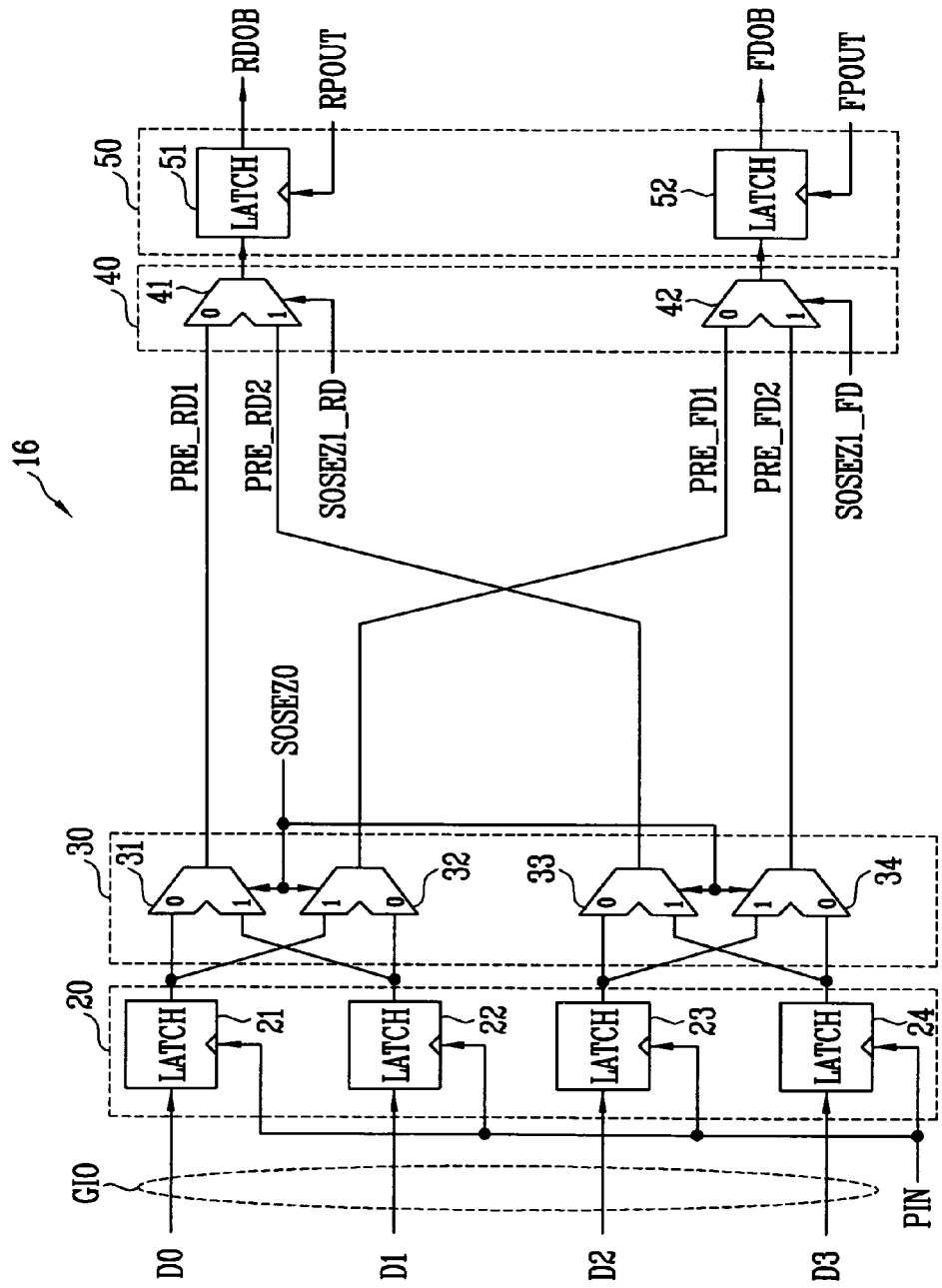
FIG. 2 is a detailed block diagram of the pipe latch circuit shown in FIG. 1.

As aforementioned, as the pipe latch circuit 100 includes four multiplexers in order to arrange the pre-fetched input data bits A0~A3 in the predetermined order, it is possible to reduce its circuit area more than the conventional pipe latch circuit 16 shown in FIG. 2. For example, a semiconductor memory device with a data input/output width of x16 needs 64 pipe latch circuits. Therefore, the pipe latch circuit 100 may reduce the circuit area by the occupation of 128 (2*64) multiplexers, less than the conventional pipe latch circuit 16, in the x16 semiconductor memory device. As a result, the overall chip size may be reduced, saving current consumption of the pipe latch circuit as well.

Figure 9:
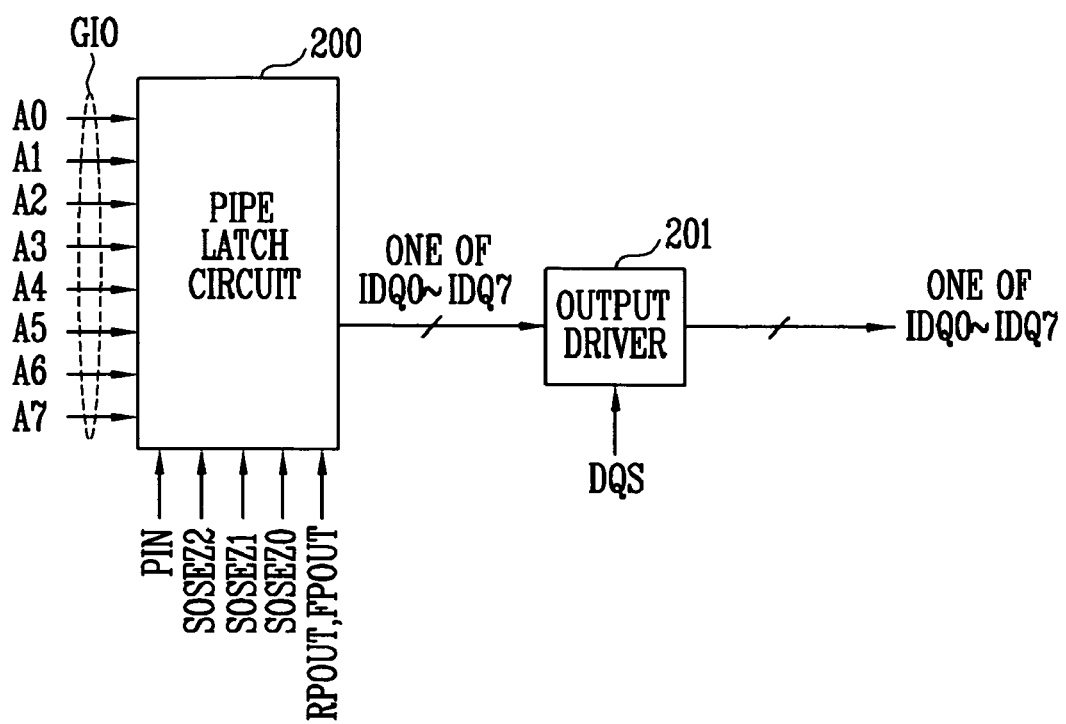
FIG. 9 is a block diagram illustrating a pipe latch circuit and an output driver in accordance with another embodiment of the present invention.

FIG. 9 is a block diagram illustrating a pipe latch circuit and an output driver in accordance with another embodiment of the present invention. The pipe latch circuit shown in FIG. 9 may be applicable to a semiconductor memory device (e.g., DDR2 SDRAM) employing an 8-bit pre-fetch scheme. Referring to FIG. 9, the pipe latch circuit 200 receives input data bits A0~A7, which are simultaneously pre-fetched from the core circuit (not shown), through a global input/output line GIO. The pipe latch circuit 200 outputs one of output data IDQ0~IDQ7 in response to an input latch control signal PIN, selection control signals SOSEZ2, SOSEZ1, and SOSEZ0, and output latch control signals RPOUT and FPOUT. The output data IDQ0~IDQ7 each contain the input data bits A0~A7 arranged in different orders each other. The output driver 201 outputs one of the output data IDQ0~IDQ7, which are received from the pipe latch circuit 200, in response to an output control signal DQS.

FIG. 10 is a detailed block diagram illustrating the pipe latch circuit shown in FIG. 9. Referring to FIG. 10, the pipe latch circuit 200 is comprised of a first latch circuit 210, a first multiplexing circuit 220, a second multiplexing circuit 230, a third multiplexing circuit 240, and a second latch circuit 250. The first latch circuit 210 includes an even latch circuit 211 and an odd latch circuit 212. The even latch circuit 211 includes latches EL1~EL4, and the odd latch circuit 212 includes latches OL1~OL4. The latches EL1~EL4 hold even-ordered bits among the pre-fetched input data bits A0~A7, i.e., the input data bits A0, A4, A2, and A2, in response to the input latch control signal PIN. And, the latches OL1~OL4 hold odd-ordered bits among the pre-fetched input data bits A0~A7, i.e., the input data bits A1, A5, A3, and A7, in response to the input latch control signal PIN. The input latch control signal PIN is enabled in response to a read command that is provided for the pre-fetch of the input data bits A0~A7.

The first multiplexing circuit 220 includes multiplexers 221~224. The multiplexer 221 selects one of first group of the input data bits A0 and A4, which are received from the latches EL1 and EL2, in response to the selection control signal SOSEZ2, and then outputs a selection data bit PRD1. In detail, when the selection control signal SOSEZ2 is on logic '1' (or enabled), the multiplexer 221 selects the input data bit A4. When the selection control signal SOSEZ2 is on logic '0' (or disabled), the multiplexer 221 selects the input data bit A0.

The multiplexer 222 selects one of second group of the input data bits A2 and A6, which are received from the latches EL3 and EL4, in response to the selection control signal SOSEZ2, and then outputs a selection data bit PRD2. In more detail, when the selection control signal SOSEZ2 is on logic '1' (or enabled), the multiplexer 222 selects the input data bit A6. When the selection control signal SOSEZ2 is on logic '0' (or disabled), the multiplexer 222 selects the input data bit A2.

The multiplexer 223 selects one of third group of the input data bits A1 and A5, which are received from the latches OL1 and OL2, in response to the selection control signal SOSEZ2, and then outputs a selection data bit PFD1. In more detail, when the selection control signal SOSEZ2 is on logic '1' (or enabled), the multiplexer 223 selects the input data bit A5. When the selection control signal SOSEZ2 is on logic '0' (or disabled), the multiplexer 223 selects the input data bit A1. The multiplexer 224 selects one of fourth group of the input data bits A3 and A7, which are received from the latches OL3 and OL4, in response to the selection control signal SOSEZ2, and then outputs a selection data bit PFD2. In more detail, when the selection control signal SOSEZ2 is on logic '1' (or enabled), the multiplexer 224 selects the input data bit A7. When the selection control signal SOSEZ2 is on logic '0' (or disabled), the multiplexer 224 selects the input data bit A3.

The second multiplexing circuit 230 includes multiplexers 231 and 232. The multiplexer 231 selects one of the selection data bits PRD1 and PRD2 in response to the selection control signal SOSEZ1 and outputs a selection data bit MX1. In detail, the multiplexer 231 selects the selection data bit PRD2 when the selection control signal SOSEZ1 is on logic '1' (or enabled), while selects the selection data bit PRD1 when the selection control signal SOSEZ1 is on logic '0' (or disabled). The multiplexer 232 selects one of the selection data bits PFD1 and PFD2 in response to the selection control signal SOSEZ1 and outputs a selection data bit MX2. In detail, the multiplexer 232 selects the selection data bit PFD2 when the selection control signal SOSEZ1 is on logic '1' (or enabled), while selects the selection data bit PFD1 when the selection control signal SOSEZ1 is on logic '0' (or disabled).

The multiplexing circuit 240 includes multiplexers 241 and 242. The multiplexing circuit 240 sets a sequence of output data from the second multiplexing circuit 230 in response to the selection control signal SOSEZ0. The multiplexer 241 selects one of the selection data bits MX1 and MX2 as the first output data in response to the selection control signal SOSEZ0. Also, the multiplexer 242 selects the other of the selection data bits MX1 and MX2 as the second output data in response to the selection control signal SOSEZ0. In more detail, when the selection control signal SOSEZ0 is on logic '1', the multiplexer 241 selects the selection data bit MX2 while the multiplexer 242 selects the selection data bit MX1. When the selection control signal SOSEZ0 is on logic '0', the multiplexer 241 selects the selection data bit MX1 while the multiplexer 242 selects the selection data bit MX2.

Here, the selection control signals SOSEZ2, SOSEZ1, and SOSEZ0 are enabled or disabled dependent on values of partial lower bits of column address signals supplied from the external when the read command is active for the pre-fetch of the input data bits A0~A7. In more detail, logical states of the selection control signals are determined by the values of the three lower bits.

The second latch circuit 250 includes latches 251 and 252. The latch 251 holds an output signal of the multiplexer 241 in response to the output latch control signal RPOUT and then outputs the latched signal as an output data bit RD. The latch 252 holds an output signal of the multiplexer 242 in response to the output latch control signal FPOUT and then outputs the latched signal as an output data bit FD. While this, the output latch control signals RPOUT and FPOUT are alternately enabled. In more detail, after the output latch control signal RPOUT is first enabled, the output latch control signal FPOUT is enabled. As a result, one of the output data IDQ0~IDQ7, including the output data RD and FD, is output from the pipe latch circuit 200. In FIG. 10, as the detailed structures and operations of the latches EL1~EL4, OL1~OL4, 211, and 212 are similar to those of the latch 113 as shown in FIG. 5, so will not be described further. Also, as the detailed structures and operations of the multiplexers 221~224 and 231~242 are similar to those of the multiplexer 121 as shown in FIG. 6, so will not be described further.

Now, it will be described about an operation of the pipe latch circuit 200 in detail. FIG. 11 is a timing diagram illustrating waveforms of signals involved in the sequential mode of the pipe latch circuit shown in FIG. 10. Referring to FIG. 11, the input data bits A0~A7 of 8 bits are simultaneously pre-fetched from the internal core circuit of the semiconductor memory device in response to the read command READ. The first latch circuit 210 of the pipe latch circuit 200 simultaneously holds and outputs the input data bits A0~A7, which are received through the global input/output line GIO, in response to the input latch control signal PIN. For instance, when the lowest bits B2B1B0 (not shown) of a column address signal received when the read command READ is generated is '000' (i.e., the bits B1B0 is all zeros), the selection control signal SOSEZ2 becomes logical '0' that is the same with the bit B2 at the first time and changes inversely whenever the 4-bit data is output from the second latch circuit 250. And, the selection control signal SOSEZ1 becomes logical '0' that is the same with the bit B1 at the first time and changes inversely whenever the 4-bit data is output from the second latch circuit 250. During this, the selection control signal SOSEZ0 retains logical '0' as same as the bit B0 until the input data bits A0~A7 are completely output by the pipe latch circuit 100.

At the first time, as the selection control signal SOSEZ2 is laid on logical '0', the multiplexer 221 selects and outputs the input data bit A0 as the selection data bit PRD1 while the multiplexer 222 selects and outputs the input data bit A2 as the selection data bit PRD2. The multiplexer 223 selects and outputs the input data bit A1 as the selection data bit PFD1 while the multiplexer 224 selects and outputs the input data bit A3 as the selection data bit PFD2.

And, as the selection control signals SOSEZ1 is laid on logical '0', the multiplexer 231 selects the data bit PRD1 and outputs the selection data bit MX1 while the multiplexer 232 selects the data bit PFD1 and outputs the selection data bit MX2.

As the selection control signals SOSEZ0 is laid on logical '0', the multiplexer 241 selects and outputs the selection data bit MX1 while the multiplexer 242 selects and outputs the selection data bit MX2. The latch 251 of the second latch circuit 250 holds the selection data bit MX1 in response to the output latch control signal RPOUT and then outputs the output data bit RD. As a result, the output data bits RD contains information of the input data bit A0. The latch 252 of the second latch circuit 250 holds the selection data bit MX1 in response to the output latch control signal FPOUT and then outputs the output data bit FD. As a result, the output data bits FD contains information of the input data bit A1.

After then, the selection control signals SOSEZ2 and SOSEZ0 are maintained on logical '1' while the selection control signal SOSEZ1 changes to logical '1'. Thus, the multiplexers 221~224 select the input data bits A0, A2, A1, and A3 and output the selection data bits PRD1, PRD2, PRD3, and PRD4. Further, the multiplexers, 231 and 232, selectively output the selection data bits, MX1 and MX2, from the data bits PRD2 and PFD2, respectively. The multiplexers 241 and 242 selectively output the selection data bits MX1 and MX2, respectively. The latches 251 and 252 hold the selection data bits MX1 and MX2 and outputs the output data bits RD and FD, respectively. As a result, the selection data bits, RD and FD, contain the information of the input data bits A2 and A3, respectively.

After then, the selection control signal SOSEZ0 is maintained on logical '0' while the selection control signals SOSEZ2 and SOSEZ1 change to logical '1' and '0' respectively. Thus, the multiplexers 221~224 select the input data bits A4, A6, A5, and A7, and output the selection data bits PRD1, PRD2, PRD3, and PRD4, respectively. Further, the multiplexers, 231 and 232, selectively output the selection data bits, MX1 and MX2, from the data bits PRD1 and PFD1, respectively. The later operations are similar to the aforementioned. As a result, the selection data bits, RD and FD, contain the information of the input data bits A4 and A5, respectively.

Further, the selection control signals SOSEZ2 and SOSEZ1 are maintained on logical '1' and '0' respectively while the selection control signal SOSEZ0 changes to logical '1' again. Thus, the multiplexers 221~224 select the input data bits A4, A6, A5, and A7, and output the selection data bits PRD2, PRD2, PRD3, and PRD4, respectively. Further, the multiplexers, 231 and 232, selectively output the selection data bits, MX1 and MX2, from the data bits PRD2 and PFD2, respectively. As a result, the selection data bits, RD and FD, contain the information of the input data bits A6 and A7, respectively. Thus, the pipe latch circuit 200 generates the output data IDQ0 in the order of A0, A1, A2, A3, A4, A5, A6, and A7 when the bits B2B1B0 of the column address signal are set on '000'.

When the bits B2B1B0 is valued with '001' (i.e., the decimal value of the bits B1B0 is 1), the pipe latch circuit 200 operates as similar as the aforementioned, generating the output data IDQ1 in the order of A1, A0, A3, A2, A5, A4, A7, and A6, as shown in FIG. 11.

When the bits B2B1B0 is valued with '010' (i.e., the decimal value of the bits B1B0 is 2), the pipe latch circuit 200 operates as similar as the aforementioned, generating the output data IDQ2 in the order of A2, A3, A0, A1, A6, A7, A4, and A5, as shown in FIG. 11.

When the bits B2B1B0 is valued with '011' (i.e., the decimal value of the bits B1B0 is 3), the pipe latch circuit 200 operates as similar as the aforementioned, generating the output data IDQ3 in the order of A3, A2, A1, A0, A7, A6, A5, and A4, as shown in FIG. 11.

When the bits B2B1B0 is valued with '100' (i.e., the decimal value of the bits B1B0 is 4), the pipe latch circuit 200 operates as similar as the aforementioned, generating the output data IDQ4 in the order of A4, A5, A6, A7, A0, A1, A2, and A3, as shown in FIG. 1.

When the bits B2B1B0 is valued with '101' (i.e., the decimal value of the bits B1B0 is 5), the pipe latch circuit 200 operates as similar as the aforementioned, generating the output data IDQ5 in the order of A5, A4, A7, A6, A1, A0, A3, and A3, as shown in FIG. 11.

When the bits B2B1B0 is valued with '110' (i.e., the decimal value of the bits B1B0 is 6), the pipe latch circuit 200 operates as similar as the aforementioned, generating the output data IDQ6 in the order of A6, A7, A4, A5, A2, A3, A0, and A1, as shown in FIG. 11.

When the bits B2B1B0 is valued with '111' (i.e., the decimal value of the bits B1B0 is 7), the pipe latch circuit 200 operates as similar as the aforementioned, generating the output data IDQ7 in the order of A7, A6, A5, A4, A3, A2, A1, and A0, as shown in FIG. 11. As aforementioned, as the pipe latch circuit 200 is able to arrange the pre-fetched input data bits A0~A3 in the predetermined order by means of eight multiplexers.

As described above, the present invention cuts down the overall chip size and current consumption of the pipe latch circuit by reducing the number of multiplexers necessary for arranging the pre-fetched data in a predetermined output order.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A pipe latch circuit of semiconductor memory device, comprising:
    a first latch circuit for latching pre-fetched plural bits of input data from global input/output lines;
    a first multiplexing circuit comprising a first multiplexer for receiving only even-ordered bits of the pre-fetched plural bits outputted from the first latch circuit and selecting one of the even-ordered bits in response to a first selection control signal, and a second multiplexer for receiving only odd-ordered bits of the pre-fetched plural bits outputted from the first latch circuit and selecting one of the odd-ordered bits in response to a second selection control signal;
    a second multiplexing circuit for setting a sequence of output data from the first multiplexing circuit in response to a third selection control signal; and
    a second latch circuit comprising a third latch for latching a first output data from the second multiplexing circuit in response to a first output latch control signal and a fourth latch for latching a second output data from the second multiplexing circuit in response to a second output latch control signal.

2. The pipe latch circuit as set forth in claim 1, wherein the first latch circuit comprises:
    a first group of latch for latching the even-ordered bits of the pre-fetched plural bits of input data; and
    a second group of latch for latching the odd-ordered bits of the pre-fetched plural bits of input data.

3. The pipe latch circuit as set forth in claim 1, wherein logical levels of the first and second selection control signals are determined by values of partial lower bits of a column address signal received from an external system when bits of the plural bits of input data are simultaneously pre-fetched.

4. The pipe latch circuit as set forth in claim 1, wherein the second multiplexing circuit comprises:
    a third multiplexer for selecting one input data from the first multiplexer and the second multiplexer as the first output data in response to the third selection control signal; and
    a fourth multiplexer for selecting the other input data from the first multiplexer and the second multiplexer as the second output data in response to the third selection control signal.

5. The pipe latch circuit as set forth in claim 1, wherein logical levels of the first and second selection control signals are determined by a value of one among two lower bits of a column address signal received from an external system when bits of the plural bits input data are simultaneously pre-fetched, while a logical level of the third selection control signal is determined by the other among the two lower bits.

6. The pipe latch circuit as set forth in claim 1, wherein the first and second multiplexing circuits operate in a sequential or interleaving mode in response to the first, second and third selection signals, and a data output order of the second latch circuit in the sequential mode is different from that in the interleaving mode.

7. The pipe latch circuit as set forth in claim 1, wherein logical level of the first output latch control signal is contrary to the second output latch control signal.

* * * * *